ELECTROMAGNETIC WAVE AMPLIFIER INCLUDING A NEGATIVE RESISTANCE SEMICONDUCTOR DIODE STRUCTURE

Filed Feb. 3, 1969 2 Sheets-Sheet 1

INVENTORS D. J. BARTELINK
B. R. CHAWLA
BY [signature]
ATTORNEY 3,526,844

ELECTROMAGNETIC WAVE AMPLIFIER INCLUDING A NEGATIVE RESISTANCE SEMICONDUCTOR DIODE STRUCTURE

Dirk J. Bartelink, Morris Township, Morris County, and Basant R. Chawla, North Plainfield, N.J., assignors to Bell Telephone Laboratories, Incorporated, Murray Hill, N.J., a corporation of New York Filed Feb. 3, 1969, Ser. No. 795,849
Int. Cl. H03f *3/04*
U.S. Cl. 330—5 14 Claims

ABSTRACT OF THE DISCLOSURE

Described herein are layered structures of both M-I-S (metal-insulator-semiconductor) and D-S (high dielectric constant layer semiconductor), wherein the semiconductor is biased in a negative differential mobility state; for the purpose of amplifying electromagnetic waves incident thereon. The metal layer or the very high dielectric constant layer serves to suppress the formation of space-charge domains which would otherwise arise in the semiconductor, thereby stabilizing the semiconductor and enabling amplification of electromagnetic waves propagating in the semiconductor.

FIELD OF THE INVENTION

This invention relates to the semiconductor devices which are used as amplifiers of electromagnetic waves.

BACKGROUND OF THE INVENTION

When a semiconductor, such as gallium arsenide, is biased in its negative differential mobility state, the possibility arises as to the use of such a semiconductor as an amplifier of electromagnetic waves in the semiconductor. However, the simultaneous formation of space-charge domains in the semiconductor creates instabilities due to the resulting space-charge waves, which tends to destroy the ability of the semiconductor to exhibit negative differential conductivity in the negative differential mobility "n.d.m." state. See, for example, J. B. Gunn, "Instabilities of Current in III–V Semiconductors," IBM Journal of Research & Development 8, 141–159 (1964). Thus, only by taking steps to inhibit the formation of such space-charge domains, may amplification of the electromagnetic wave be achieved. For example, as described in the copending application of J. A. Copeland, Ser. No. 564,081, filed on July 11, 1966, and having a common assignee, it is possible to limit the space-charge domain formation in a semiconductor by means of biasing the semiconductor in the n.d.m. state only for periods of time which are short as compared with the space-charge domain formation time. This mode of operation is therefore known as "limited space charge accumulation" (L.S.A.).

Space-charge domain inhibition can also be achieved by using so-called "subcritically" doped semiconductors. In the case of an N-type gallium arsenide semiconductor layer, this means that NL, the mathematical product of the net significant donor impurity concentration "doping" and the length of the semiconductor along the direction of the current caused by the bias voltage, must be less than about $2\times10^{11}$ per cm.$^2$. See, for example, P. N. Robson et al., "Two-Port Microwave Amplification in Long Samples of Gallium Arsenide," IEEE Tran. Electron Devices, ED–14, 612–615 (1967). However, for semiconductor layers of moderate length, this restriction limits the "doping" to such a low value that power generation in the device is severely limited, and impedance matching is made difficult.

SUMMARY OF THE INVENTION

According to an embodiment of this invention, in a semiconductor negative resistance type of electromagnetic wave amplifier, space-charge domain formation in the negative differential mobility (n.d.m.) state of the semiconductor is inhibited during operation by means of a metal layer in close proximity to the semiconductor, but insulated from the semiconductor. Thereby, a metal-semiconductor-insulator (M-I-S) layered structure is formed in which the metal layer furnishes induced "image" charges of any space charges in the semiconductor. These "image" charges oppose the tendency of the space charges in the semiconductor, in its n.d.m. state, to coalesce and form space-charge domains. Such an M-I-S structure may advantageously be used to amplify electromagnetic waves propagating in and interacting with the semiconductor, when the semiconductor is electrically biased as a diode in its n.d.m. state. It is important for proper operation that the electromagnetic wave to be amplified has a non-vanishing component of electric field in the semiconductor parallel to the direction along which phenomenom of n.d.m. is present.

In a particular embodiment, the metal layer in the M-I-S structure comprises an array of parallel metal strips, which have been deposited on the insulator layer. The insulator layer is, for example, silicon dioxide which has been deposited on a gallium arsenide semiconductor epitaxial layer having N-type conductivity. In turn, this N-type gallium arsenide layer has been epitaxially grown on a relatively intrinsic gallium arsenside substrate. The N-type gallium arsenide layer furnishes a medium which can be biased into its n.d.m. state.

Denoting the plane of a major surface of the insulator layer as the $xz$ plane, the metal strips run along the $x$ direction perpendicular to the $z$ component of the electric field in the electromagnetic wave to be amplified. Advantageously, these metal strips have a width in the $z$ direction which is approximately equal to the thickness of the insulator layer multiplied by the ratio of the avalanche breakdown electric field in this insulator layer to the minimum electric field for the Gun effect in the N-type semiconductor. Such design prevents undesired avalanche breakdown during operation. The metal strips are spaced apart in the $z$ direction by a distance which is advantageously equal to or greater than twice the thickness of the insulating layer. In this manner, during operation of the M-I-S structure as a negative resistance amplifier, the metal strips will initially pick up just enough static electric charge to prevent further breakdown. These metal strips will also provide, by means of induced transient charge therein, electric fields in the N-type semiconductor sufficient to suppress any domain formation.

The insulator layer in the M-I-S structure of this invention advantageously has a thickness, in the $y$ direction perpendicular to the said $xz$ plane, of approximately 500 A. or less. Thereby, the metal strips are located sufficiently close to the N-type gallium arsenide semiconductor, in order to create significant induced "image" charges in the metal strips to oppose the formation of any space-charge domains in this semiconductor. Moreover, the N-type gallium arsenide layer itself has a relatively low resistivity, due to a net significant donor impurity concentration of approximately $10^{15}$ per cm.$^3$ or more. Finally, this N-type gallium arsenide layer has a thickness advantageously of the order of 5 microns or less in the $y$ direction, in order that the forces set up by the induced "image" charges in the metal strips be effective to suppress domain formation at the distance ranges in the $y$ direction throughout this semiconductor layer. The thickness in the $y$ direction of the N-type gallium arsenide layer, in any event, is large enough to avoid any appreciable "field-effect pinch" in the presence of the electric fields during operation; that is to say the depletion layer does not penetrate into an appreciable fraction of the N-type layer.

According to another embodiment of this invention, an electromagnetic wave amplifier device is made of a semiconductor coated with a dielectric layer having a very high dielectric constant relative to the N-type semiconductor layer. This dielectric layer serves similar function as the metal-insulator layer of the previously described embodiment, since the very high dielectric constant material behaves somewhat like an electrical conductor at the high frequencies (of the space-charge waves) and like an insulator at the low frequencies of the voltage bias required for negative differential mobility in the semiconductor.

BRIEF DESCRIPTION OF THE DRAWING

This invention, together with its features, objects, and advantages, may be better understood from the following detailed description when read in conjunction with the drawings in which.

DETAILED DESCRIPTION

Figure 1:
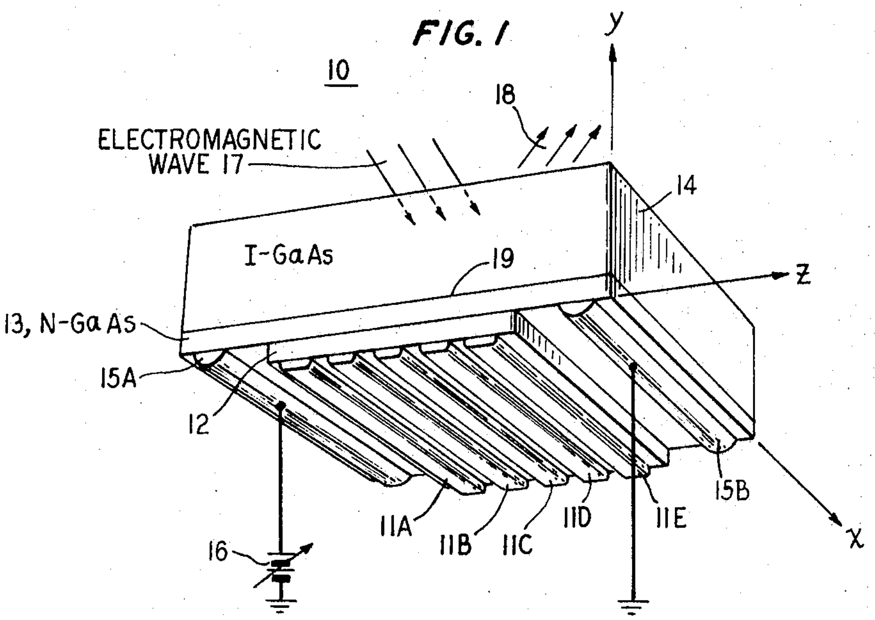
FIG. 1 is a perspective view of a biased semiconductor diode structure, in accordance with an embodiment of the invention.

As shown in FIG. 1, an M-I-S parallel layered diode structure 10 consists of metal strips 11A–E; an insulator layer 12; an N-type semiconductive medium, the N-type gallium arsenide layer 13; and an intrinsic gallium arsenide semiconductive single crystal substrate 14, typically having a cross-section of the order of $10^{-2}$ cm.$^2$ in the $xz$ plane. Typically, the semiconductor layer 13 is N-type gallium arsenide which has been epitaxially grown upon the substrate 14 by conventional vapor deposition; whereas the insulator layer 12 is any good quality insulator such as silicon dioxide, which has been deposited to a uniform thickness upon the layer 13 by means of known vaporization, or other deposition techniques. The substrate 14 serves as mechanical support as well as a seed for growth of the layer 13. The metal strips 11A–E are typically also deposited by conventional vaporization techniques upon the insulator layer 12. The semiconductor layer 13 has a thickness (in the $y$ direction) of about 4 microns, and has relatively low resistivity due to a net significant donor impurity concentration of about $1.5\times10^{15}$ per cm.$^3$; whereas the substrate 14 has a relatively high resistivity, the net significant impurity concentration therein being less than about $10^{13}$ per cm.$^3$.

The insulator layer 12 has a thickness (in the $y$ direction of about 600 A., and it is important that this thickness be quite uniform. By means of well-known masking and etching techniques, this insulator layer 12 does not extend over a whole major surface of the semiconductor layer 13, in order that there be some space on this surface of the semiconductor layer 13 for the ohmic electrodes 15A and 15B. The metal strips 11A–E each have a thickness of about 0.10 micron or more; and a width (in the $z$ direction) equal to approximately 0.1 mm., that is, approximately equal to the thickness of the insulator layer 12 multiplied by the ratio of its breakdown field, $10^7$ volt/cm., to the minimum field in the semiconductor layer 13 for the Gunn effect, $3\times10^3$ volt/cm. The spacing in the $z$ direction between next neighboring metal strips 11A–E is advantageously at least about twice the thickness of the insulator layer 12 in the $y$ direction; that is, at least 0.1 micron or more, which is obtained by the masking and etching of a vapor deposited metal layer. This design prevents continuous insulator breakdown during operation of the diode 10, although an initial breakdown will occur which electrically charges the metal strips 11A–E to desirable electrostatic potentials.

It should be recognized that mathematical product of NL, as defined above, in the diode 10 is equal to about $10^{13}$ per cm.$^2$ for each of the metal strips 11A–E; so that the value of NL for the five strips is more than $5\times10^{13}$ per cm.$^2$ due to the spacings therebetween. Thus, NL over the whole diode 10 is more than two orders of magnitude greater than the value of $2\times10^{11}$ per cm.$^2$ in the prior art devices, so that much greater power generation is feasible than in the prior art. Moreover, the number of metal strips can be further increased to provide even greater values of NL if desired.

Electrodes 15A and 15B, typically of vacuum deposited aluminum, are connected through the battery 16 to the ground as shown in FIG. 1. The battery 16 is adjusted to supply sufficient D.C. voltage to bias electrically the gallium arsenide semiconductor layer 13 in the negative differential mobility state. Typically, the electric field bias in the $z$ direction produced by the battery 16 in the semiconductor layer 13 is approximately 4200 volt/cm.; so that the voltage of the battery 16 is adjusted to a value equal to the distance between electrodes 15A and 15B multiplied by 4200 volt/cm. Thereby, a biasing current flows in the semiconductor layer 13 parallel to the $z$ direction.

An electromagnetic wave 17 to be amplified is incident upon the electrically biased diode structure 10. This wave 17 advantageously has an A.C. electric wave field vector E with a nonvanishing $z$ component. The wave 17 is incident upon the relatively transparent intrinsic semiconductor substrate 14 and is amplified upon propagation in and reflection by the N-type semiconductor layer 13 continuously during such operation. The metal strips 11A–E, during operation, will initially acquire actual surface charges by reason of initial avalanche breakdowns only; and hence, voltage potentials relative to ground will be established in these metal strips. These voltage potentials persist during operation of the structure 10 as an amplifier of the incident wave 17. On the other hand, during the continuous operation of the diode structure 10, these metal strips will also sporadically develop additional induced "image" charges which oppose the formation of space-charge domains in the semiconductor layer 13.

The amplified electromagnetic wave 18 emanates from the structure 10, through the top surface 19 of the layer 13 serving as a port for extraction of this amplified wave 18. In the layer 13 itself, the electromagnetic wave field advantageously has a nonvanishing $z$ component of electric field E, which interacts with the semiconductor medium 13 in its negative differential mobility state.

Moreover, the thickness of the N-type gallium arsenide layer 13 can also be as large as about 8 microns. Amplification can take place to the upper frequency limit of the negative differential conductivity. The growth of space-charge waves due to space-charge domains is suppressed by means of the arrangement shown in FIG. 1 of the structure 10, for space-charge waves of angular frequency up to the order of $10^{10}$ radians per second. Moreover, charge carrier diffusion prevents space charge waves having angular frequencies of the order of $10^{10}$ radians per second and higher.

Figure 2:
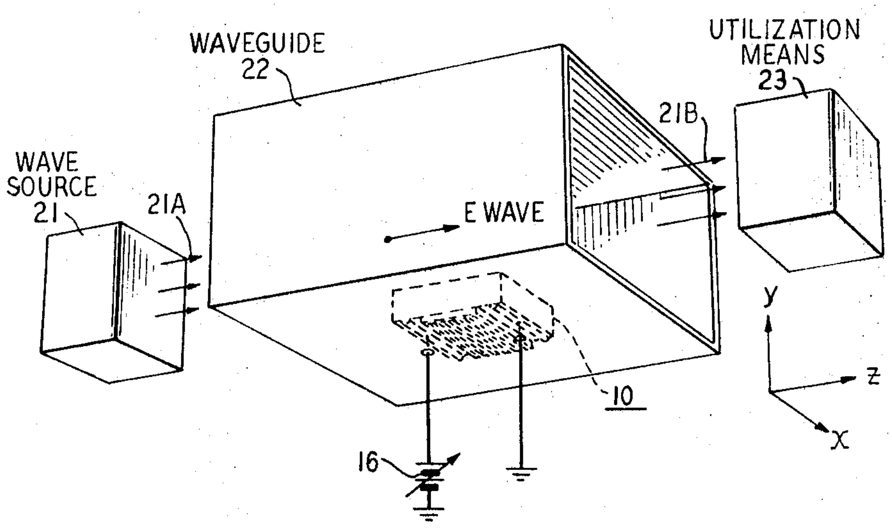
FIG. 2 is a perspective diagram of the diode (shown in FIG. 1) in the presence of an electromagnetic field in a waveguide, according to another aspect of this invention.

FIG. 2 illustrates an arrangement for use of the structure 10 as an electromagnetic wave amplifier. As shown in FIG. 2, the previously described biased M-I-S structure 10 is located in waveguide 22. The metal strips 11A–E are mechanically attached to, but insulated from, the walls of the waveguide 22 by means of an insulating layer (not shown), such as Mylar. A source of electromagnetic wave energy 21, containing angular frequency components in the range $10^6$ to $10^{12}$ radian/sec., typically of the order of $10^{10}$ radian/sec., directs the input wave 21A into the waveguide 22. The waveguide 22 supports the propagation of this input wave 21A therethrough. This wave 21A is amplified upon traversing the waveguide 22 containing the electrically biased diode 10; provided that the electromagnetic wave, propagating in the semiconductor medium 13 of the diode 10, has an electric vector with nonvanishing $z$ component in the medium 13, that is, along the direction of the biasing current in the medium 13 of the diode 10, as indicated by the arrow labeled "E WAVE" in FIG. 2. After propagating through the waveguide 22, the amplified output wave 21B is collected by the means 23 for utilization of this amplified wave as desired.

Figure 1A:
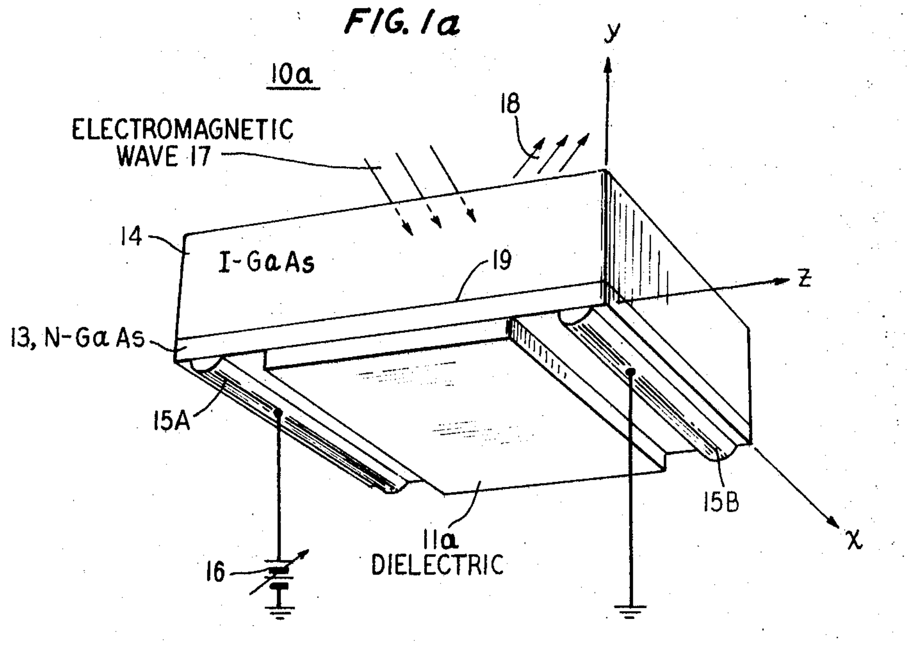
FIG. 1*a* is a perspective view of a biased semiconductor diode structure, in accordance with another embodiment of the invention.

FIG. 1*a* shows an alternative embodiment of a parallel layered diode structure 10*a*. This structure 10*a*, in all respects similar to the structure 10, except that the insulator layer 12 and the metal strips 11A–E have been replaced by a single dielectric layer 11*a*. The dielectric constant of the layer 11*a* is very high relative to vacuum, being at least about 10 times, or even as high as 100 times or more, greater than the dielectric constant of the N-type gallium arsenide layer 13. Suitable dielectric materials for the layer 11*a* include barium titanate, strontium titanate, or potassium tantalate, all of which have a dielectric constant of the order of 1000 relative to vacuum, whereas gallium arsenide has a dielectric constant of the order of 10.

As will appear more clearly from the discussion below in connection with FIG. 3, the dielectric layer 11*a* in the structure 10*a* serves a similar function as the metal-insulator layers 11A–E and 12 in the structure 10, previously discussed. Likewise, the structure 10*a* can be placed in the waveguide 22 in much the same manner as the structure 10, except of course for the fact that there is now no need for further insulating the dielectric layer 11*a* from the wall of the waveguide 22, as there was for insulating the metal strips 11A–E (with Mylar, for example). The thickness in the $y$ direction of the layer 11*a* advantageously is an order of magnitude or more greater than the thickness in the $y$ direction of N-type GaAs layer 13, so that useful space-charge domain suppression is provided by this layer 11*a*.

It is also possible to utilize the surface charges due to surface states to effect a suppression of space-charge domain formation, thus obviating the need for the dielectric layer 11*a*. In such a case, with the dielectric layer 11*a* omitted, the surface states at the interface between the N-type semiconductor layer 13 and the substrate 14 provide the means for suppressing space-charge domain formation. Moreover, in such a case, the substrate 14 advantageously is placed in direct physical contact with the bottom wall of the waveguide 22.

Figure 3:
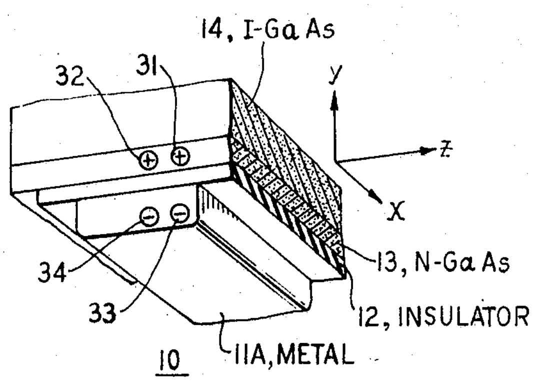
FIG. 3 is perspective view of a portion of the diode (shown in FIG. 1), helpful in understanding the invention.

The mechanism of domain inhibition in the present invention can be easily understood in the light of the well-known so-called "method of images." As shown in FIG. 3, assuming that two positive space charges 31 and 32 are created within the layer 13, then two equal but negative "image charges 33 and 34 are induced in the metal layer 11A. It should be understood that the "image" charges 33 and 34 are abstract idealizations for a more complicated actual surface charge distribution induced on the surface of the electrode 11A nearest the layer 12. These "image" charges 33 and 34 are both equal in magnitude to the space charges 31 and 32 respectively. The force between the actual charges 31 and 32 is an attractive force when the layer 13 is in the negative differential mobility state in the $z$ direction. This attractive force tends to drive the charges 31 and 32 together to form an undesirable space-charge domain. However, the induced negative "image" charge 34 exerts an additional force on the actual positive charge 31, and the induced "image" charge 33 exerts an additional force on the actual charge 32. Both of these additional forces have components along the $z$ direction which are repulsive and oppose the tendency for a space-charge domain to form in the layer 13 during the negative differential mobility state. Moreover, the additional forces exerted by the "image" charges 33 and 34 also have components along the $y$ direction along which there is positive differential mobility. Hence, these $y$ components of force tend to be dissipative, and also thereby aid in the opposition to the growth of an undesired space-charge domains.

In the case of the structure 10*a*, the dielectric layer 11*a* also furnishes "image" charges, but now due to induced polarization in the body of the dielectric layer 11*a* (rather than induced actual surface charges in the metal strips 11A–E). This induced polarization of the dielectric 11*a* can be thought of (for purposes of explanation only) as "image" charges as well, except that the value of an image charge $Q^1$ in the dielectric layer 11*a* due to a space charge Q in the semiconductive layer 13 is given by:

$$Q^1 = -\frac{K^1 - K}{QK^1 + K} \qquad (1)$$

where $K^1$ is the dielectric constant of the dielectric layer 11*a* and K is the dielectric constant of the N-type semiconductor layer 13. As is clear from Eq. 1, the dielectric constant $K^1$ dielectric layer 10*a* should advantageously be at least about 10 times larger than K (semiconductor layer 13) in order that $Q^1$ be almost as large as Q in magnitude. Thereby, $Q^1$ will make a significant contribution to the electric fields within the semiconductor layer 13 as compared with the contribution thereto by Q.

Although this invention has been described in terms of particular embodiments, many modifications are possible within the scope of the invention. The particular, various other semiconductors can be used in place of gallium arsenide, and the layer 13 can be P-type instead of N-type. Moreover, the D.C. voltage bias 16 may be replaced by an A.C. voltage bias, advantageously of a frequency at least an order of magnitude below the frequency of both the space-charge waves and the electromagnetic wave 18 to be amplified. The negative differential mobility state in the layer 13 may be induced by other means than the voltage bias 16, such as optical or other electromagnetic means. Furthermore, it should be obvious that the structure 10 or 10*a* can be used as an oscillator, which amplifies the electromagnetic wave therein as the wave is fed back and forth in the layer 13 by multiple reflections in the structure.

What is claimed is:

1. A device for amplifying an electromagnetic wave which comprises:

(a) a semiconductor medium capable of a negative differential mobility state in a first direction, a surface of the medium having a port for the extraction of an electromagnetic wave emanating from the medium after the electromagnetic wave has been amplified in the medium by reason of interaction of the electromagnetic wave with the medium in the negative differential mobility state; and (b) means for suppressing the growth of spacecharge domains in the semiconductor medium, said means comprising an insulator layer adjacent the semiconductor medium and a metal layer adjacent the insulator layer, the medium, the insulator layer, and the metal layer thereby forming a layered structure characterized in that the interface between the medium and the insulator layer is parallel to the first direction.

2. An amplifier of an electromagnetic wave comprising the device recited in claim 1 in combination with means for establishing an electric field parallel to the first direction in said semiconductor medium, in order to bias said medium in the negative differential mobilty state, the frequency of said electric field being at least about an order of magnitude lower than the frequency of the electromagnetic wave.

3. The amplifier recited in claim 2 in which the electromagnetic wave in the medium has a nonvanishing electric wave field component in said first direction.

4. A system for amplifying an electromagnetic wave comprising the amplifier recited in claim 3 in combination with waveguide means for supporting the electromagnetic wave, the semiconductor medium being located within said waveguide means.

5. The device recited in claim 1 in which the metal layer comprises a plurality of metal strips running along a portion of the surface of the semiconductor medium in a second direction which is perpendicular to said first direction.

6. The device recited in claim 5 in which each of the metal strips has a width in said first direction which is approximately equal to the thickness of the insulator layer multiplied by the ratio of the breakdown electric field in the insulator to the minimum electric field required for the Gunn effect in the semiconductor medium, the thickness of the insulator layer being measured in the direction which is perpendicular to both the first direction and the second direction.

7. The device recited in claim 5 in which the distance between successive metal strips is greater or equal to about twice the thickness of the insulator layer, the thickness of the insulator layer being measured in a third direction which is perpendicular to both the first direction and the second direction.

8. The device recited in claim 5 in which the thickness of the semiconductor medium, as measured in the third direction which is perpendicular to both the first direction and the second direction, is sufficiently large that the depletion region does not extend a significant distance into said layer.

9. The device recited in claim 1 in which the semiconductor medium is N-type gallium arsenide.

10. The device recited in claim 1 in which the mathematical product of the net significant impurity concentration in the N-type gallium arsenide medium and the length of the medium in the first direction is at least an order of magnitude greater than $2\times10^{11}$ per cm.$^2$, and in which the angular frequency of the electromagnetic waves is in the range between approximately $10^6$ and $10^{12}$ radians per second.

11. The device recited in claim 10 in which the thickness in a third direction of the semiconductor medium is approximately 4 microns, the third direction being perpendicular to a major surface of the semiconductor which is parallel to the first direction.

12. The device recited in claim 11 in which the thickness of the insulator layer in said third direction is approximately 600 A.

13. The device recited in claim 1 which includes an intrinsic semiconductive substrate upon which the said semiconductor medium has been epitaxially grown.

14. An electromagnetic wave amplifier which includes:

(a) a metal-insulator-semiconductor layered structure, said semiconductor having the property of a negative differential mobility state in response to an electric field bias;

(b) means for establishing an electric field bias parallel to a first direction in said semiconductor which is parallel to the layered structure, in order to bias said semiconductor in the negative differential mobility state;

(c) a source of the electromagnetic wave to be amplified, said layered structure being located in the path of the wave, the electromagnetic wave in the semiconductor having a component of its electric wave vector which is parallel to said first direction, whereby the electromagnetic wave is incident upon and amplified in the layered structure by reason of interaction therewith and the wave emanates from the semiconductor after having been amplified therein.

References Cited

UNITED STATES PATENTS 3,350,656 10/1967 Vural ---------------- 330—5

3,401,347 9/1968 Sumi ---------------- 330—5

OTHER REFERENCES

Kayama et al.: "Bulk GaAs Travaling-Wave Amplifier," submitted at 1968 International Conference on GaAs held at Dallas, Tex. on Oct. 16–18, 1968.

ROY LAKE, Primary Examiner

D. R. HOSTETTER, Assistant Examiner

U.S. Cl. X.R.

330—53; 331—107